US010248167B1

(12) United States Patent
Huang et al.

(10) Patent No.: US 10,248,167 B1
(45) Date of Patent: Apr. 2, 2019

(54) ELECTRONIC DEVICE HAVING HEAT DISSIPATION ASSEMBLY AND BLOCKING MEMBER

(71) Applicant: GETAC TECHNOLOGY CORPORATION, Hsinchu County (TW)

(72) Inventors: Tzu-Chiu Huang, Taipei (TW); Juei-Chi Chang, Taipei (TW)

(73) Assignee: GETAC TECHNOLOGY CORPORATION, Hsinchu County (TW)

(*) Notice: Subject to any disclaimer, the term of this patent is extended or adjusted under 35 U.S.C. 154(b) by 0 days.

(21) Appl. No.: 15/917,531

(22) Filed: Mar. 9, 2018

(30) Foreign Application Priority Data

Oct. 20, 2017 (CN) .......................... 2017 1 0982544

(51) Int. Cl.
*G06F 1/16* (2006.01)
*G06F 1/20* (2006.01)
*H05K 7/20* (2006.01)

(52) U.S. Cl.
CPC ............ *G06F 1/1656* (2013.01); *G06F 1/203* (2013.01); *H05K 7/20145* (2013.01); *H05K 7/20454* (2013.01)

(58) Field of Classification Search
CPC ... G06F 1/1656; G06F 1/203; H05K 7/20145; H05K 7/20454
USPC ........................................................ 174/520
See application file for complete search history.

(56) References Cited

U.S. PATENT DOCUMENTS

| | | | | |
|---|---|---|---|---|
| 6,217,031 B1* | 4/2001 | Catalano | ............... | F16C 19/166 277/500 |
| 6,217,032 B1* | 4/2001 | Liegeois | .............. | G02B 6/4447 174/153 G |
| 7,162,188 B2* | 1/2007 | Sudo | .................. | G03G 15/0874 399/258 |
| 7,336,489 B1* | 2/2008 | Chen | ...................... | G06F 1/203 165/104.33 |
| 7,889,495 B2* | 2/2011 | Tachikawa | .............. | G06F 1/203 165/104.33 |
| 8,964,383 B2* | 2/2015 | Degner | ................... | G06F 1/203 361/688 |
| 9,103,606 B2* | 8/2015 | Chou | ....................... | F28F 13/12 |
| 9,341,195 B2* | 5/2016 | Wang | .................... | F04D 29/703 |
| 2010/0254086 A1* | 10/2010 | Ikeda | ................. | H05K 7/20145 361/697 |
| 2018/0149271 A1* | 5/2018 | Mountz | ................... | C08L 67/00 |

* cited by examiner

*Primary Examiner* — Andargie M Aychillhum
*Assistant Examiner* — Michael F McAllister

(57) ABSTRACT

An electronic device includes a housing, a heat dissipation assembly and a blocking member. The housing has a dissipation portion. The heat dissipation portion includes a plurality of heat dissipation holes. The heat dissipation assembly is disposed in the housing. The heat dissipation assembly includes a plurality of heat dissipation fins. A channel is formed between every two adjacent heat dissipation fins. The channel has an air intake and an air outlet. The position of the air outlet is corresponded to the position of the heat dissipation portion. A surface is formed between the air intake and the air outlet. The blocking member is disposed at the surface position adjacent to the air outlet and abutted against the periphery of the heat dissipation portion.

15 Claims, 5 Drawing Sheets

ELECTRONIC DEVICE HAVING HEAT DISSIPATION ASSEMBLY AND BLOCKING MEMBER

CROSS REFERENCE TO RELATED APPLICATIONS

This Application claims priority of China Patent Application No. 201710982544.6 filed on Oct. 20, 2017, the entirety of which is incorporated by reference herein.

BACKGROUND OF THE INVENTION

Field of the Invention

The invention relates in general to an electronic device, and more particularly to an electronic device having a waterproof mechanism.

Description of the Prior Art

An electronic device includes therein multiple electronic components, which generate heat when operated continuously. To prevent the heat generated by the electronic components in the electronic device from affecting the operation performance, a heat dissipation assembly is provided in the electronic device, and a channel for dissipating heat, e.g., a through hole, is also provided at a housing of the electronic device. Once a through hole for dissipating heat is provided at the housing of the electronic device, a liquid may invade the interior of the electronic device and damage the electronic components. Therefore, a waterproof mechanism is a design focus that must be taken into account during a mechanism design phase of the electronic device.

SUMMARY OF THE INVENTION

The present invention provides an electronic device including a housing, a heat dissipation assembly and a blocking member. The housing includes a heat dissipating portion having a plurality of heat dissipating holes. The heat dissipation assembly is disposed in the housing, and includes a plurality of cooling fins. A channel exists between every two adjacent cooling fins, and includes a wind inlet port and a wind outlet port. The wind outlet port is positioned corresponding to a position of the heat dissipating portion. A border side is correspondingly formed at the cooling fins between the wind inlet port and the wind outlet port. The blocking member is positioned at the border side adjacent to the wind outlet ports, and abuts against a periphery of the heat dissipating portion.

Accordingly, the blocking member disposed at the border side of the cooling fins can block a liquid from entering an interior of the electronic device through the heat dissipating portion, providing the electronic device with waterproofness.

DETAILED DESCRIPTION OF THE EMBODIMENTS

Figure 1:
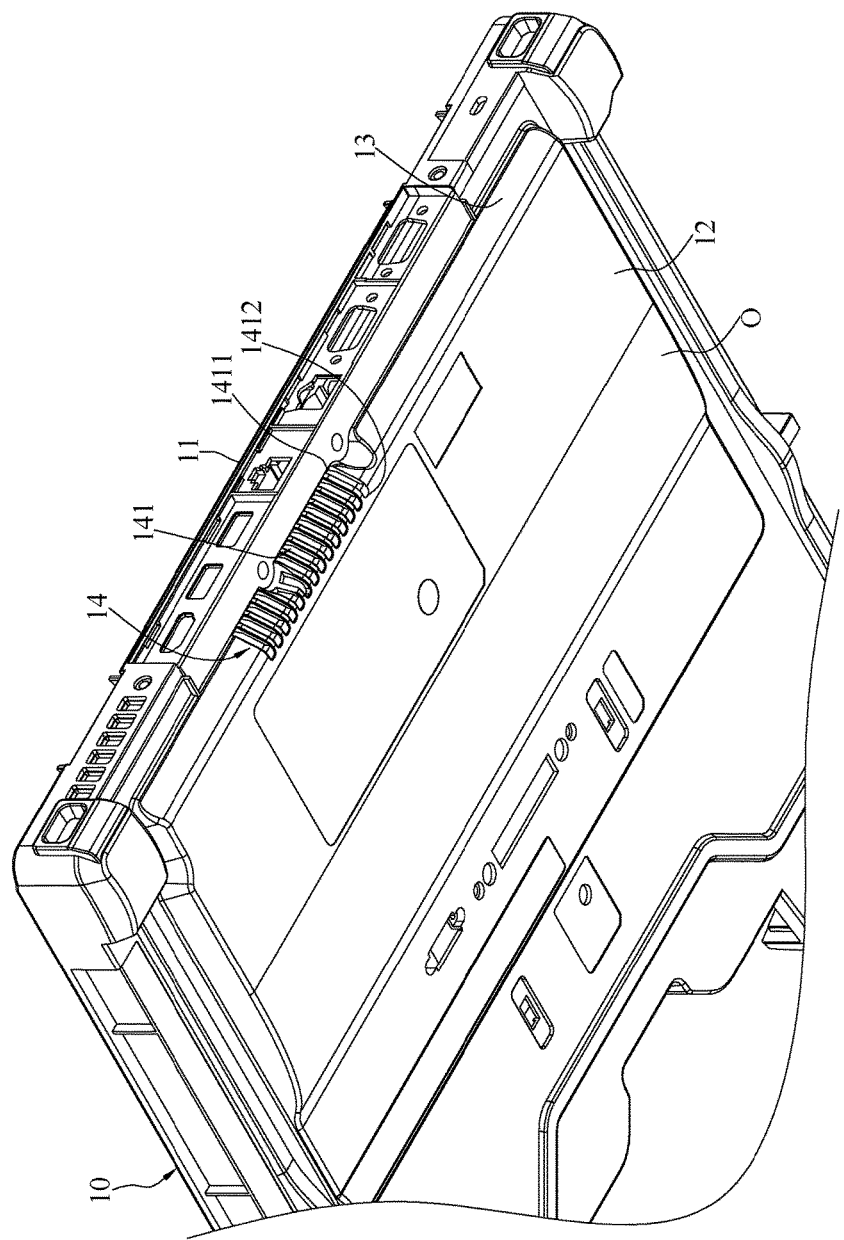
FIG. 1 is a perspective appearance schematic diagram of an electronic device according to an embodiment of the present invention.

FIG. 1 shows a perspective appearance schematic diagram according to an embodiment of the present invention. The electronic device is an electronic device including a heat dissipating portion 14, which is in communication with an interior and an exterior of the electronic device so as to provide a channel for dissipating heat from the interior of the electronic device. In this embodiment, the electronic device is, for example but not limited to, a host of a laptop computer.

Figure 2:
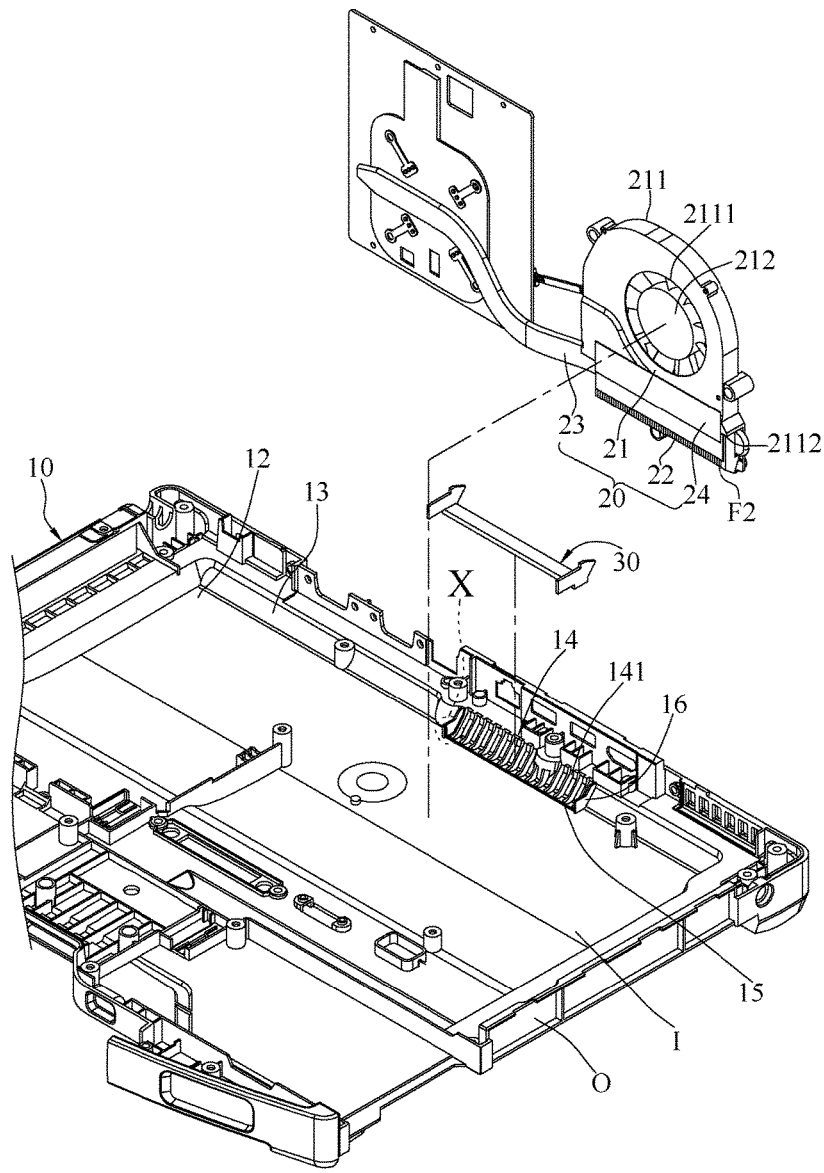
FIG. 2 is an exploded partial structural schematic diagram of an electronic device according to an embodiment of the present invention.

Referring to FIG. 1 and FIG. 2, the electronic device includes a housing 10, a heat dissipation assembly 20 and a blocking member 30. The heat dissipating portion 14 is in the housing 10, and has a plurality of heat dissipating heat holes 141. The heat dissipation assembly 20 is positioned in the housing 10 and corresponds to the heat dissipating portion 14. Heat energy generated by the electronic device is dispersed out of the housing 10 through the heat dissipating holes 141 of the heat dissipating portion 14. The blocking member 30 is located at a joint position of the heat dissipating portion 14 and the heat dissipation assembly 20 to block a liquid outside the housing 10 from invading the interior of the electronic device so as to achieve a waterproof effect.

Figure 4:
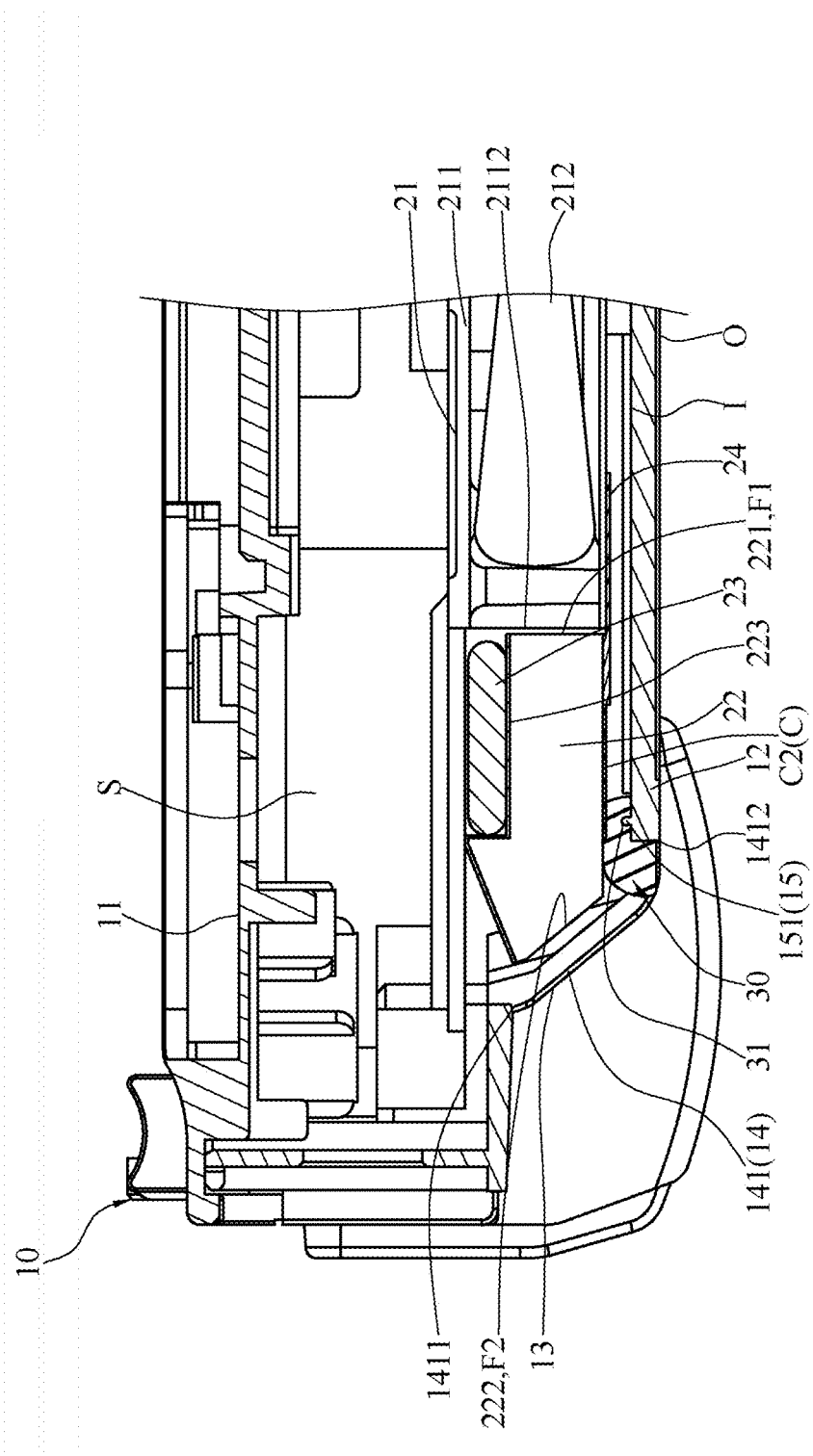
FIG. 4 is a partial sectional structural view of an electronic device according to an embodiment of the present invention.

In one embodiment, referring to FIG. 1 and FIG. 4, the housing 10 is a hollow cubic structure, and has an internal space S for installing electronic components of the electronic device. The electronic components generate heat from operations thereof, and are, for example but not limited to, a motherboard, a sound card or a display card.

Further, referring to FIG. 4, the housing 10 has an upper surface portion 11 and a lower surface portion 12 that are opposite, and a side surface portion 13 connecting the upper surface portion 11 and the lower surface portion 12. The upper surface portion 11 and the lower surface portion 12 are parallel, and a space range surrounded by the upper surface portion 11, the lower surface portion 12 and the side surface portion 13 is the internal space S. The upper surface portion 11 is for configuring a keyboard or a touch pad. The heat dissipating portion 14 is located at the side surface portion 13, and the heat dissipation assembly 20 and internal components of the electronic device are secured at the lower surface portion 12, for example but not limited thereto.

Referring to FIG. 2 as well as FIG. 4, it should be noted that, for better illustrations, FIG. 2 shows a schematic diagram of the housing 10 hiding the upper surface portion 11. The housing 10 has an inner side I and an outer side O that are opposite, with the inner side I being one side facing the internal space S. The heat dissipating portion 14 penetrates through the inner side I and the outer side O of the housing 10. The heat dissipating portion 14 has a plurality of heat dissipating holes 141 arranged side by side. Each of the heat dissipating holes 141 has a first end 1411 and a second end 1412. The first end 1411 of each heat dissipating hole 141 is close to the upper surface portion 11, and the second end 1412 is located at the lower surface portion 12. A part between the first end 1411 and the second end 1412 of each heat dissipating hole 141 is extended at the side surface portion 13 to become a long hole.

In one embodiment, referring to FIG. 2 and FIG. 4, the heat dissipation assembly 20 includes a fan 21, a plurality of cooling fins 22 and a hot tube 23. The fan 21 may be a centrifugal fan, for example but not limited thereto. In this embodiment, the fan 21 includes a casing 211 and a fan wheel 212. The casing 211 has a wind absorbing port 2111 and a wind discharging port 2112. Opening directions of the wind absorbing port 2111 and the wind discharging port 2112 are perpendicular. The fan wheel 212 can be rotatably disposed in the casing 211, and absorbs hot air in the internal space S through the wind absorbing port 2111 into the casing 211 and discharges the hot air through the wind discharging port 2112. The cooling fins 22 are long thin plate-like structures, and each has a wind receiving end 221 and a wind exiting end 222. The wind receiving end 221 of each cooling fin 22 is adjacent to the wind discharging port 2112 of the fan 21, and the wind exiting end 222 of each cooling fin 22 is positioned away from the wind discharging port 2112.

More specifically, referring to FIG. 2, the plurality of cooling fins 22 are spaced and arranged in parallel within a range of the wind discharging port 2112, such that a channel F is formed between every two adjacent cooling fins 22. Thus, the air discharged from the wind discharging port 2112 of the fan 21 passes through the channels F and come into thorough contact with the cooling fins 22 before being discharged outwards, allowing the air discharged by the fan 21 with a fully exercised heat dissipation effect. Further, each of the channels F has a wind inlet opening F1 and a wind outlet opening F2. The wind inlet opening F1 is located between the wind receiving ends 221 of every two adjacent cooling fins 22, and the wind outlet opening F2 is located between the wind exiting ends 222 of every two adjacent cooling fins 22. At this point, the wind outlet openings F2 of the channels F are positioned corresponding to the positions of the respective heat dissipating holes 141 of the heat dissipating portion 14. Further, to prevent the air from the fan 21 towards the cooling fins 22 from leaking at intersections of the fan 21 and the cooling fins 22, one side of the wind discharging port 2112 of the fan 21 and the wind receiving ends 221 of the cooling fins 22 may be further provided with a leakproof tape 24. The leakproof tape 24 faces the lower portion surface 12 of the housing 10, and at least covers the intersections of the wind discharging port 2112 of the fan 21 and the wind receiving ends 221 of the cooling fins 22. In this embodiment, a range covered by the leakproof tape 24 on the cooling fins 22 is spaced from the wind exiting ends 222 of the cooling fins 22.

Further, the cooling fins 22 of this embodiment have identical appearance and shape. After the cooling fins 22 are arranged side by side, the cooling fins 22 appear as the cooling fins 22 in a side-by-side arrangement when viewed in a direction towards the channels F, as the viewing angle in FIG. 5. At this point, an outline between the wind inlet openings F1 and the wind outlet openings F2 of the cooling fins 22 in a side-by-side arrangement is a border side C in a quadrilateral.

In one embodiment, the blocking member 30 is made of a compressible and non-water-absorbent material. For example but not limited, the blocking member 30 is made of foam sponge. Further, referring to FIG. 4 and FIG. 5, the blocking member 30 is adhered at the inner surface I of the housing 10, and is located at the border side C of the cooling fins 22 to abut against a periphery of the heat dissipating portion 14, thereby preventing a liquid from invading the interior of the electronic device by disposing the blocking member 30 around the heat dissipating portion 14 in communication with the interior and the exterior of the housing 10.

Figure 3:
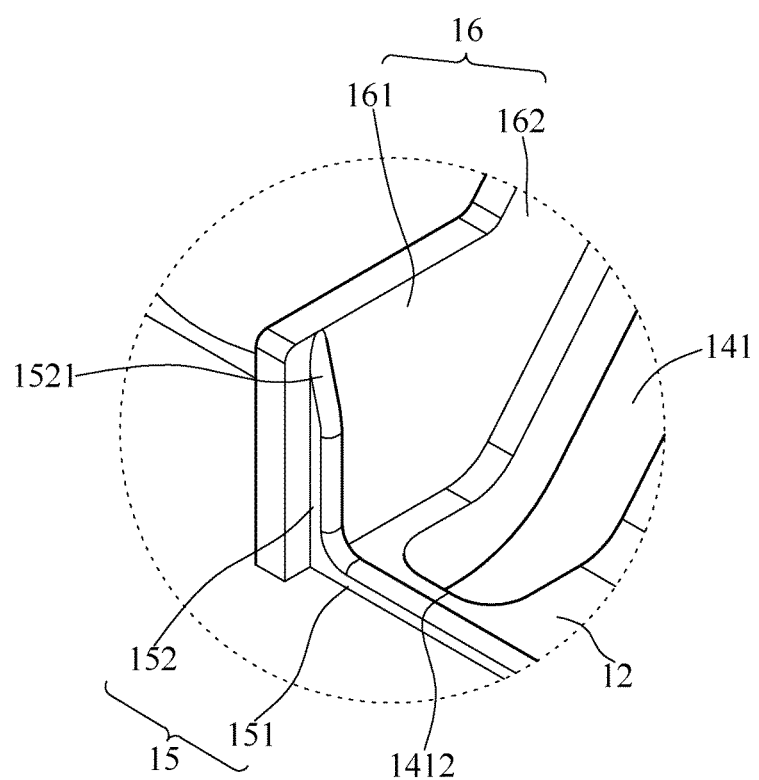
FIG. 3 is an enlarged partial view of FIG. 2.

In one embodiment, referring to FIG. 2 to FIG. 4, the inner surface I of the housing 10 corresponding to the lower surface portion 12 is further provided with a pressing portion 15. The pressing portion 15 protrudes from the inner surface I, and is located around the heat dissipating portion 14. More specifically, the pressing portion 15 extends along a direction of the heat dissipating holes 141 in a side-by-side arrangement. Thus, because the pressing portion 15 protrudes from the inner surface I, when a liquid is accidently seeped into the housing 10 from the exterior of the housing 10, the pressing portion 15 protruding from the inner side I further forms another blocking barrier in addition to providing a stopping effect, thereby more reliably stopping the liquid from entering the interior of the electronic device.

Referring to FIG. 4, the blocking member 30 has a compression edge 31 that is shaped correspondingly to the shape of a contour of the pressing portion 15. Thus, the pressing portion 15 of the housing 10 can be embedded into the compression edge 31 and be tightly adhered with the blocking member 30, reducing the gap between the pressing portion 15 and the blocking member 30, increasing a contact area between the pressing portion 15 and the blocking member 30, and enhancing liquid tightness. In this embodiment, the hardness of the pressing portion 15 is greater than the hardness of the blocking member 30, and so the compression edge 31 is generated when the blocking member 30 presses against the pressing portion 15 during the assembly process. Further, the pressing portion 15 and the housing 10 may be, for example but not limited to, a formed integral.

Figure 5:
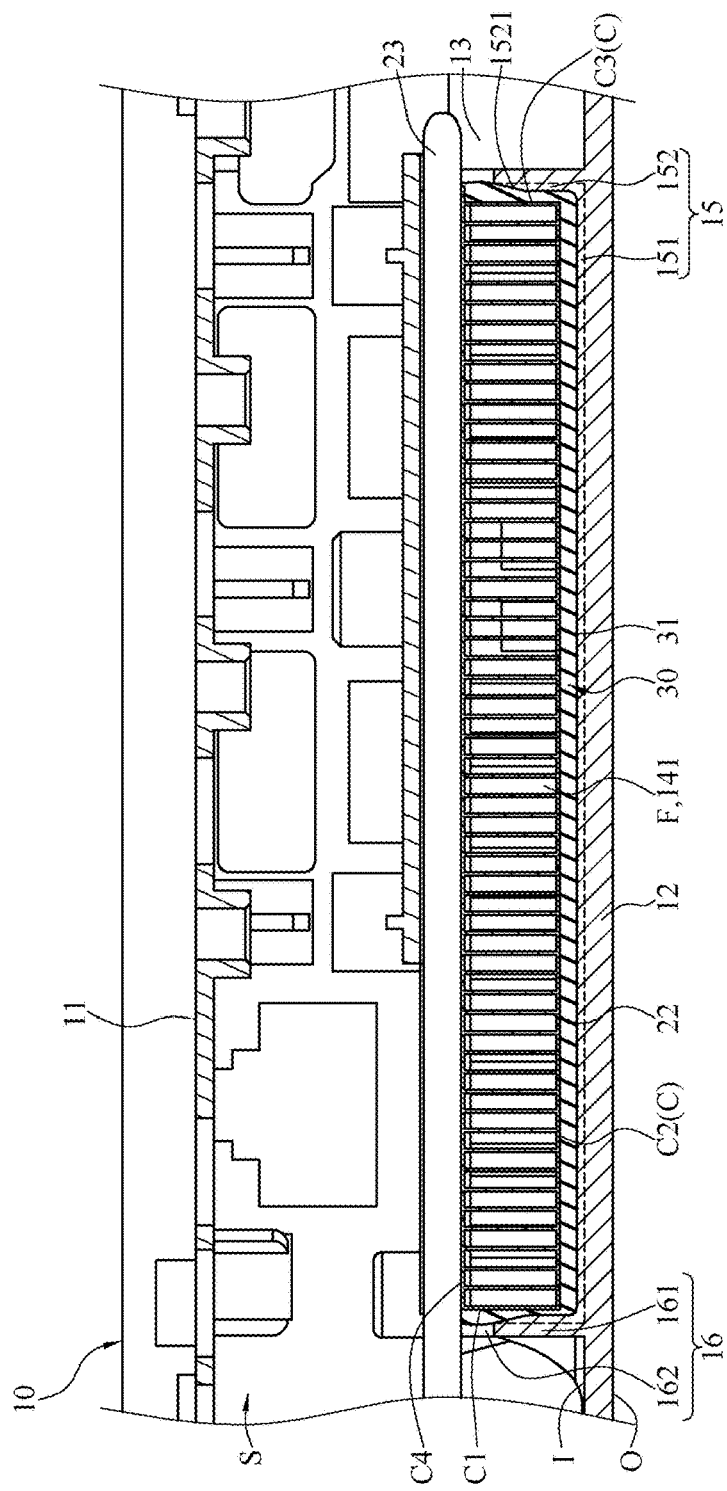
FIG. 5 is a partial sectional structural view of an electronic device from another viewing angle according to an embodiment of the present invention.

To enhance liquid tightness, referring to FIG. 2, FIG. 3 and FIG. 5, the inner surface I of the housing 10 is further provided with two stopping walls 16. The two stopping walls 16 are plate-like structures, are respectively located at two sides of first and last heat dissipating holes 141 of the heat dissipating holes 141 in a side-by-side arrangement, and erect perpendicularly at positions of the inner side I corresponding to the lower surface portion 12.

Further, referring to FIG. 3 and FIG. 5, each of the stopping walls 16 of the embodiment include a first stopping portion 161 and a second stopping portion 162. The first stopping portion 161 erects perpendicularly at a position of inner surface I corresponding to the lower surface portion 12, and the second stopping portion 162 extends along the side surface portion 13 of the housing 10. A distance of the second stopping portion 162 between the upper surface portion 11 and the lower surface portion 12 is at least equal to a distance of the heat dissipating holes 141 between the upper surface portion 11 and the lower surface portion 12. With the stopping walls 16 provided, the waterproof effect is further enhanced.

In this embodiment, referring to FIG. 5, the pressing portion 15 is located within a range of the two stopping walls 16. Thus, the pressing portion 15 and the blocking walls 16 are located around the heat dissipating portion 14 to further achieve a total waterproof effect. Further, a distance between the two stopping walls 16 may be equal to a thickness distance of the plurality of cooling fins 22 in a side-by-side arrangement. As such, when the heat dissipation assembly 20 is assembled to the housing 10, the wind receiving ends 221 of the cooling fins 22 can be plugged at the wind discharging port 2112 of the fan 21, and the wind exiting ends 222 can be plugged between the two stopping walls 16, allowing the heat dissipation assembly 20 to more stably combine with the housing 10.

Preferably, referring to FIG. 5, the pressing portion 15 has a first pressing section 151 and a second pressing section 152. One end of each of two second pressing section 152 is connected to the first pressing section 151, and the other end is extended towards the direction of the upper surface portion 11. The two second pressing sections 152 are respectively located at two ends of the first pressing section 151 to form a U-shape. At this point, the first pressing section 151 is extended along the side-by-side arrangement direction of the heat dissipating holes 141 and are adhered to the lower surface portion 12. The second pressing section 152 is perpendicular to the second pressing section 151 are is located at one side of the stopping wall 16 facing the heat dissipating holes 141. In this embodiment, positions corresponding to the first pressing section 151 and the second pressing section 152 are provided with the blocking member 30, thus increasing the contact area between the blocking member 30 and the pressing portion 15, further enhancing liquid tightness as well as the liquid-tight effect.

Further, referring to FIG. 3, a surface of the pressing portion 15 facing the blocking member 30 is an arc surface. Thus, when the blocking member 30 correspondingly presses against the pressing portion 15, the arc surface of the blocking member 30 is free from stress concentration, such that the pressure generated between the blocking member 30 and the pressing portion 15 does not result in damage of the blocking member 30, hence more reliably forming pre-pressure on the blocking member 30, and enhancing the tightness between the blocking member 30 and the pressing portion 15.

Referring to FIG. 2, FIG. 3 and FIG. 5, the heat dissipation assembly 20 can be first combined with the blocking member 30 and then assembled to the housing 10. To facilitate the assembly of the heat dissipation assembly 20, one end of the second pressing section 152 extending towards the upper surface portion 11 is further provided with an inclined guiding surface 1521, which gradually reduces towards the upper surface portion 11. Thus, when the heat dissipation assembly 20 is plugged between the two blocking walls 16 by using the cooling fins 22, in order to provide the blocking member 30 between the heat dissipation assembly 20 and the housing 10 with pre-pressure, the heat dissipation assembly 20 can be assembled from a position of the second pressing section 152 having the inclined guiding surface 1521 towards the first pressing section 151. Thus, the inclined guiding surface 1521 can gradually guide the blocking member 30 to move towards the first pressing section 151, and gradually apply a pressure on the blocking member 30 during the moving process of the blocking member 30. Thus, when the blocking member 30 moves to abut against the first pressing section 151, the blocking member 30 is applied with pre-pressure and becomes positioned, accordingly enhancing the liquid tightness of the blocking member 30.

Further, referring to FIG. 5, from a direction facing the channels F, the border side C at the cooling fins 22 in a side-by-side arrangement is quadrilateral, and includes a first side C1, a second side C2, a third side C3 and a fourth side C4 that are sequentially connected. The blocking member 30 is at least located at the second side C2. The blocking member 30 may also be located at the first side C1, the second side C2 and the third side C3, or simultaneously located at the first side C1, the second side C2, the third side C3 and the fourth side C4.

Again referring to FIG. 4 and FIG. 5, when the blocking member 30 is at least located at the second side C2, the blocking member 30 can block a liquid outside the electronic device from entering the interior of the electronic device through the second ends 1412 of the heat dissipating holes 141. When the blocking member 30 is simultaneously located at the first side C1, the second side C2 and the third side C3, in addition to more reliably blocking a liquid outside the electronic device from entering the interior of the electronic device through the second ends 1412 of the heat dissipating holes 141, when a liquid outside the electronic device accidently seeps into the electronic device, the liquid is effectively prohibited from spreading all around, thus minimizing the damage on the interior of the electronic device. When the blocking member 30 is simultaneously located at the first side C1, the second side C2, the third side C3 and the fourth side C4, in addition to more thoroughly exercising the blocking effect around the heat dissipating portion 14, the blocking member 30 completely enclosing the border side C of the cooling fins 22 further provides the cooling fins 22 with a positioning effect, allowing the cooling fins 22 to have a more stable structural configuration.

It should be noted that, referring to FIG. 4, the heat dissipation assembly 20 is assembled by using the wind outlet opening F2 between every two cooling fins 22 and towards the direction of the heat dissipating holes 141 of the housing 10. Thus, in order to allow the blocking member 30 to reliably exercise the effect of blocking a liquid from invading the interior of the electronic device, the blocking member 30 is preferably extended from a position of the wind outlet opening F2 of the cooling fin 22 to a position between the wind outlet opening F2 and the wind inlet opening F1. That is, it is ensured that the liquid outside the electronic device is blocked by the blocking member 30 at the heat dissipating holes 141, so as to achieve an even better waterproof effect.

Further, in addition to generating a waterproof effect through the blocking member 30, the present invention can further achieve a waterproof effect through the appearance of the housing 10. In one embodiment, referring to FIG. 4, the side surface portion 13 of the housing 10 is in an inclined pattern relative to the upper surface portion 11 and the lower surface portion 12. As such, the heat dissipating holes 141 provided at the side surface portion 13 become inclined long holes corresponding to the side surface portion 13. At this point, the inclined pattern of the side surface portion 13 causes the second ends 1412 of the heat dissipating holes 141 to be closer to the cooling fins 22 compared to the first ends 1411.

When the electronic device is in a normal utilization state, the electronic device is usually used with the upper surface portion 11 of the housing 10 facing up and the lower surface portion 12 facing down. In this embodiment, when a liquid is present in an application environment of the electronic device, due to the force of gravity, the liquid flows from top to bottom. In this situation, the upper surface portion 11 of the housing 10 under the normal utilization state protrudes from the lower surface portion 12, and the upper surface portion 11 provides a shielding effect similar to eaves compared to the side surface portion 13. Thus, when the liquid flows downwards from the upper surface portion 11 of the housing 10, the liquid does not directly flow into the heat dissipating holes 141, and most of the liquid is blocked from entering the interior of the electronic device, hence achieving a waterproof effect.

In one embodiment, the shape of the cooling fins 22 is not limited to being quadrilateral plates. Referring to FIG. 4, the cooling fins are polygonal plates in this embodiment. At this point, from a direction between the wind receiving ends 221 and the wind exiting ends 222 of the cooling fins 22, the wind receiving ends 221 of the cooling fins 22 are extended along a direction perpendicular to the lower surface portion 12, and an extension direction of the wind exiting ends 222 is inclined at the lower surface portion 12. Thus, the wind receiving ends 221 of the cooling fins 22 can correspond to the contour of the wind discharging port 2112 of most commercially available fans 21, and the wind exiting ends 222 can correspond to the inclined heat dissipating holes 141 such as in the foregoing embodiment. Accordingly, the contact area between the air discharged by the fan 21 and the heat cooling fins 22 can be increased to enhance the heat dissipation effect.

Further, referring to FIG. 2 and FIG. 4, one side of each cooling fin 22 facing the upper surface portion 11 of the housing 10 has a recessed angle 223, which is extended to the wind receiving end 221 of the cooling fin 22. In this embodiment, the recessed angle 223 is 90 degrees. At this point, when the cooling fins 22 are arranged side by side and assembled, the recessed angles 223 of the cooling fins 22 form a 90-degree recessed space. In this embodiment, when the cooling fins 22 are assembled with the fan 21, the recessed angles 223 are in communication with the wind discharging port 2112 of the fan 21.

Thus, one end of the hot tube 23 of the heat dissipation assembly 20 can be adhered in the recessed angle 223 of each cooling fin 22, and the other end of the hot tube 23 is extended on the electronic components provided at the lower surface portion 12. An inner surface of the hot tube 23 is an enclosed tube body having a capillary structure, and the hot tube 23 accommodates therein an operating fluid. As such, the other end of the hot tube 23 in contact with heat generated by the electronic components in operation form an evaporation end. The operating fluid at the evaporation end absorbs the heat energy of the electronic components and flows towards one end adhered to the cooling fins 22 such that the one end becomes a condensation end. The vapor at the condensation end of the hot tube 23 is condensed into the liquid-state operating fluid, which then flows back to the evaporation end to continually perform the above cyclic operation, thereby quickly conducting the heat energy of the electronic components to the entire hot tube 23 to generate an even-temperature effect. Under the above configuration, because of the condensation end of the hot tube 23 is located in the recessed angles 223 of the cooling fins 22 facing the upper surface portion 11 and the evaporation end is located at the lower surface portion 12 of the housing 10, under a normal utilization state of the electronic device (with the upper surface portion 11 on the top and the lower surface portion 12 at the bottom), the evaporated gaseous operating fluid is allowed to quickly drift upwards towards the condensation end, and the condensed liquid-state operating fluid is allowed to quickly descend to the evaporation end, accordingly enhancing the even-temperature operating efficiency of the hot tube 23.

In this embodiment, the hot air discharged by the hot tube 23 and the wind discharging port 2112 of the fan 21, when coming into contact with the cooling fins 22, quickly conducts heat energy to the cooling fins 22 having large surface areas, and the airflow generated by the fan 21 can assist the heat energy to be quickly conducted and dissipated to achieve a heat dissipation effect.

In conclusion, the present invention achieves a waterproof effect through the blocking member 30 disposed between around the heat dissipating holes 141 of the housing 10 and the heat dissipation assembly 20 of the electronic device.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, comprising:
   a housing comprising an exterior wall of the electronic device and a heat dissipating portion having a plurality of heat dissipating holes formed in the exterior wall, wherein the exterior wall comprises an inner side facing an interior of the electronic device;
   a heat dissipation assembly, disposed in the housing, comprising a plurality of cooling fins, a channel forming between every two adjacent cooling fins, each of the channels having a wind inlet port and a wind outlet port, the wind outlet ports positioned corresponding to a position of the heat dissipating portion, the cooling fins having a border side between the wind inlet ports and the wind outlet ports; and
   a blocking member disposed at the inner side immediately adjacent to the heating dissipating holes and at a position of the border side adjacent to the wind outlet ports and abutting against a periphery of the heat dissipating portion.

2. The electronic device according to claim 1, wherein the periphery of the heat dissipating portion of the housing is further provided with a pressing portion, a hardness of the pressing portion is greater than a hardness of the blocking portion, and the blocking portion is abutted against the pressing portion.

3. The electronic device according to claim 2, wherein the exterior wall further comprises an outer side opposite to the inner side, the heat dissipating portion penetrates through the inner side and the outer side, the pressing portion protrudes from the inner side, and the blocking member is adhered at the inner side and close to the pressing portion.

4. The electronic device according to claim 2, wherein the blocking member has a compression edge, and the pressing portion is embedded into the compression edge.

5. The electronic device according to claim 1, wherein the exterior wall further comprises an upper surface portion and a lower surface portion that are opposite, a side surface portion is provided between the upper surface portion and the lower surface portion, and the heat dissipating holes are located at the side surface portion.

6. The electronic device according to claim 5, wherein each of the heat dissipating holes has a first end and a second end, the first end is close to the upper surface portion, the second end is close to the lower surface portion, and the first end is closer to the cooling fin compared to the second end.

7. The electronic device according to claim 5, wherein the border side of the cooling fins comprises a first side, a second side, a third side and a fourth side, the second side of the cooling fins is adhered to the lower surface portion, the first side and the third side are respectively located at two ends of the second side, the fourth side is opposite the second side, and the blocking member is located at the first side, the second side, the third side and the fourth side.

8. The electronic device according to claim 6, wherein the border side of the cooling fins comprises a first side, a second side, a third side and a fourth side, the second side of the cooling fins is adhered to the lower surface portion, the first side and the third side are respectively located at two ends of the second side, the fourth side is opposite the second side, and the blocking member is located at the first side, the second side, the third side and the fourth side.

9. The electronic device according to claim 5, wherein the border side of the cooling fins comprises a first side, a second side, a third side and a fourth side, the second side of the cooling fins is adhered to the lower surface portion, the first side and the third side are respectively located at two ends of the second side, the fourth side is opposite the second side, and the blocking member is located at the first side, the second side and the third side.

10. The electronic device according to claim 6, wherein the border side of the cooling fins comprises a first side, a second side, a third side and a fourth side, the second side of the cooling fins is adhered to the lower surface portion, the first side and the third side are respectively located at two ends of the second side, the fourth side is opposite the second side, and the blocking member is located at the first side, the second side and the third side.

11. The electronic device according to claim 1, wherein the blocking member is extended from the wind outlet ports to a position between the wind outlet ports and the wind inlet ports.

12. The electronic device according to claim 2, wherein the exterior wall has an upper surface and a lower surface that are opposite, a side surface is provided between the upper surface and the lower surface, the heat dissipating holes are located at the side surface, the pressing portion has a first pressing section and a second pressing section, the first pressing section is adhered to the lower surface portion, one end of the second pressing portion is connected to the first pressing portion and one other end is extended towards the upper surface portion, and one other end of the second pressing portion further has an inclined guiding surface.

13. The electronic device according to claim 1, wherein the blocking member is made of a compressible material.

14. The electronic device according to claim 13, wherein the blocking member is made of foam sponge.

15. The electronic device according to claim 1, wherein the heat dissipating holes communicate directly with ambient.

* * * * *